United States Patent
Dawson et al.

(10) Patent No.: US 9,926,187 B2
(45) Date of Patent: Mar. 27, 2018

(54) MICROELECTROMECHANICAL SYSTEM DEVICES HAVING CRACK RESISTANT MEMBRANE STRUCTURES AND METHODS FOR THE FABRICATION THEREOF

(71) Applicants: Chad S Dawson, Queen Creek, AZ (US); Dubravka Bilic, Scottsdale, AZ (US); Lianjun Liu, Chandler, AZ (US); Andrew C McNeil, Chandler, AZ (US)

(72) Inventors: Chad S Dawson, Queen Creek, AZ (US); Dubravka Bilic, Scottsdale, AZ (US); Lianjun Liu, Chandler, AZ (US); Andrew C McNeil, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 560 days.

(21) Appl. No.: 14/537,498

(22) Filed: Nov. 10, 2014

(65) Prior Publication Data

US 2015/0059484 A1 Mar. 5, 2015
US 2017/0341926 A9 Nov. 30, 2017

Related U.S. Application Data

(62) Division of application No. 13/753,034, filed on Jan. 29, 2013, now Pat. No. 8,921,952.

(51) Int. Cl.
*G01L 9/12* (2006.01)
*B81B 3/00* (2006.01)
*G01L 9/00* (2006.01)

(52) U.S. Cl.
CPC ............ *B81B 3/007* (2013.01); *G01L 9/0072* (2013.01); *B81B 2201/0264* (2013.01); *B81B 2203/0127* (2013.01)

(58) Field of Classification Search
CPC ......... B81B 3/00; B81B 3/0018; H01L 21/30; H01L 21/50; H01L 29/84; H01L 9/12
See application file for complete search history.

(56) References Cited

U.S. PATENT DOCUMENTS

| 4,742,020 A | 5/1988 | Roy | |
|---|---|---|---|
| 5,911,111 A * | 6/1999 | Bohr | .......... H01L 21/3212 257/E21.206 |

(Continued)

FOREIGN PATENT DOCUMENTS

| CN | 101405215 A | 4/2009 |
|---|---|---|
| CN | 101742389 A | 6/2010 |
| CN | 101832831 A | 9/2010 |

OTHER PUBLICATIONS

Chinese Office Action for Patent Appln. No. CN201410032683.9 (dated Jul. 1, 2016).

*Primary Examiner* — Nguyen Ha
(74) *Attorney, Agent, or Firm* — Charlene R. Jacobsen (57) ABSTRACT

Methods for fabricating crack resistant Microelectromechanical (MEMS) devices are provided, as are MEMS devices produced pursuant to such methods. In one embodiment, the method includes forming a sacrificial body over a substrate, producing a multi-layer membrane structure on the substrate, and removing at least a portion of the sacrificial body to form an inner cavity within the multi-layer membrane structure. The multi-layer membrane structure is produced by first forming a base membrane layer over and around the sacrificial body such that the base membrane layer has a non-planar upper surface. A predetermined thickness of the base membrane layer is then removed to impart the base membrane layer with a planar upper surface. A cap membrane layer is formed over the planar upper surface of the base membrane layer. The cap membrane layer is composed of a material having a substantially parallel grain orientation.

18 Claims, 8 Drawing Sheets

(56) References Cited

U.S. PATENT DOCUMENTS

| | | | |
|---|---|---|---|
| 6,012,336 A * | 1/2000 | Eaton | B81C 1/00246 73/754 |
| 6,541,833 B2 | 4/2003 | Werner et al. | |
| 8,218,286 B2 | 7/2012 | Wu et al. | |
| 9,130,012 B2 | 9/2015 | Yamaguchi | |
| 2001/0002710 A1 | 6/2001 | Roberts et al. | |
| 2006/0081042 A1* | 4/2006 | Silverbrook | B60C 23/0408 73/146 |
| 2007/0042521 A1 | 2/2007 | Yama | |
| 2007/0138582 A1 | 6/2007 | Nystrom et al. | |
| 2012/0211805 A1* | 8/2012 | Winkler | B81C 1/00246 257/254 |
| 2012/0256237 A1* | 10/2012 | Lakamraju | B81C 1/00246 257/254 |
| 2013/0167640 A1* | 7/2013 | Lim | G01P 15/0802 73/514.01 |
| 2013/0327149 A1* | 12/2013 | Nakatani | G01L 9/12 73/754 |

\* cited by examiner

MICROELECTROMECHANICAL SYSTEM DEVICES HAVING CRACK RESISTANT MEMBRANE STRUCTURES AND METHODS FOR THE FABRICATION THEREOF

CROSS-REFERENCE TO RELATED APPLICATION

This application is a divisional of co-pending U.S. application Ser. No. 13/753,034, filed Jan. 29, 2013.

TECHNICAL FIELD

Embodiments of the present invention relate generally to microelectronic devices and, more particularly, to Microelectromechanical (MEMS) pressure sensors and other enclosed-cavity MEMS devices, as well as to methods for fabricating such MEMS devices.

BACKGROUND

Microelectromechanical systems (MEMS) devices are employed as actuators, switches, and sensors (e.g., inertial sensors, pressure sensors, etc.) in various different applications. For example, many electronic devices utilize MEMS capacitive pressure sensors to detect changes in the pressure of a surrounding fluid, such as air. By common design, a MEMS capacitive pressure sensor functions by measuring the deflection of at least one flexible polysilicon diaphragm, which encloses a hermetically-sealed cavity containing a known reference pressure. The reference pressure acts on an inner face of the flexible polysilicon diaphragm, while the opposing face of the diaphragm is exposed to the fluid for which pressure measurements are taken. During operation of the MEMS sensor, the diaphragm deflects with variations in the external pressure and the corresponding variations in the pressure differential across the body of the diaphragm. An electrode (commonly referred to as the "bottom plate") is provided below the diaphragm and is separated therefrom by a vertical gap. As the flexible membrane is also fabricated from an electrically-conductive polysilicon material, the membrane serves as a top plate forming a capacitive coupling with the bottom plate. This capacitance varies with deflection of the electrically-conductive diaphragm toward or away from the bottom plate. Thus, by measuring changes in this capacitance, variations in the external pressure acting on the exposed face of the diaphragm can be determined.

BRIEF DESCRIPTION OF THE DRAWINGS

At least one example of the present invention will hereinafter be described in conjunction with the following figures, wherein like numerals denote like elements, and.

For simplicity and clarity of illustration, the drawing figures illustrate the general manner of construction and may omit depiction, descriptions, and details of well-known features and techniques to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. Any implementation described herein as exemplary is not necessarily to be construed as preferred or advantageous over other implementations. Furthermore, there is no intention to be bound by any theory presented in the preceding Background or the following Detailed Description.

Terms such as "first," "second," "third," "fourth," and the like, if appearing in the description and the subsequent claims, may be utilized to distinguish between similar elements and are not necessarily used to indicate a particular sequential or chronological order. Such terms may thus be used interchangeably. Furthermore, embodiments of the invention are capable of operation in sequences other than those illustrated or otherwise described herein. As further appearing herein, terms such as "comprise," "include," "have," and the like are intended to cover non-exclusive inclusions, such that a process, method, article, or apparatus described as comprising, including, or having one or more elements is not necessarily limited to those elements, but may include other elements not expressly listed or inherent to such process, method, article, or apparatus. Terms such as "substantial," "substantially," and the like are utilized to indicate that a particular feature or condition is sufficient to accomplish a stated purpose in a practical manner and that minor imperfections or variations, if any, are not significant for the stated purpose. Finally, as still further appearing herein, terms such as "over," "under," "on," and the like are utilized to indicate relative position between two structural elements or layers and not necessarily to denote physical contact between structural elements or layers. Thus, a structure or layer may be described as fabricated "over" or "on"

a substrate without indicating that the structure or layer necessarily contacts the substrate due to, for example, presence of one or more intervening layers.

Embodiments of the below-described fabrication method are especially useful in the manufacture of MEMS capacitive pressure sensors and are consequently primarily described below in the context of such devices. It is emphasized, however, that embodiments of the below-described fabrication method can be utilized to produce other MEMS devices, including MEMS inertial sensors (e.g., accelerometers, gyroscopes, magnetometers, and so on) and actuators, having an inner cavity at least partially enclosed by a multi-layer membrane structure and produced via the deposition and removal of a sacrificial body of material. As will be described below, at least the uppermost layer of the membrane structure is formed from polycrystalline silicon having a substantially parallel crystalline grain structure, which is substantially free of irregularities or disparities in grain orientation that could otherwise structurally weaken the membrane. In the case of a MEMS pressure sensor, the membrane structure will typically include a flexible diaphragm portion, and the cavity enclosed by the membrane structure will typically be hermetically sealed and contain a known reference pressure. This notwithstanding, the membrane structure need not be hermetically sealed and/or may not include a flexible diaphragm portion in all embodiments. For example, in alternative embodiments, the membrane structure may serve as a substantially rigid cap or cover that sealingly encloses a transducer element or proof mass (in embodiments wherein the MEMS device assumes the form of an accelerometer or gyroscope), a resonator structure (in embodiments wherein the MEMS device assumes the form of an oscillator), or a similar structure or device.

Figure 1:
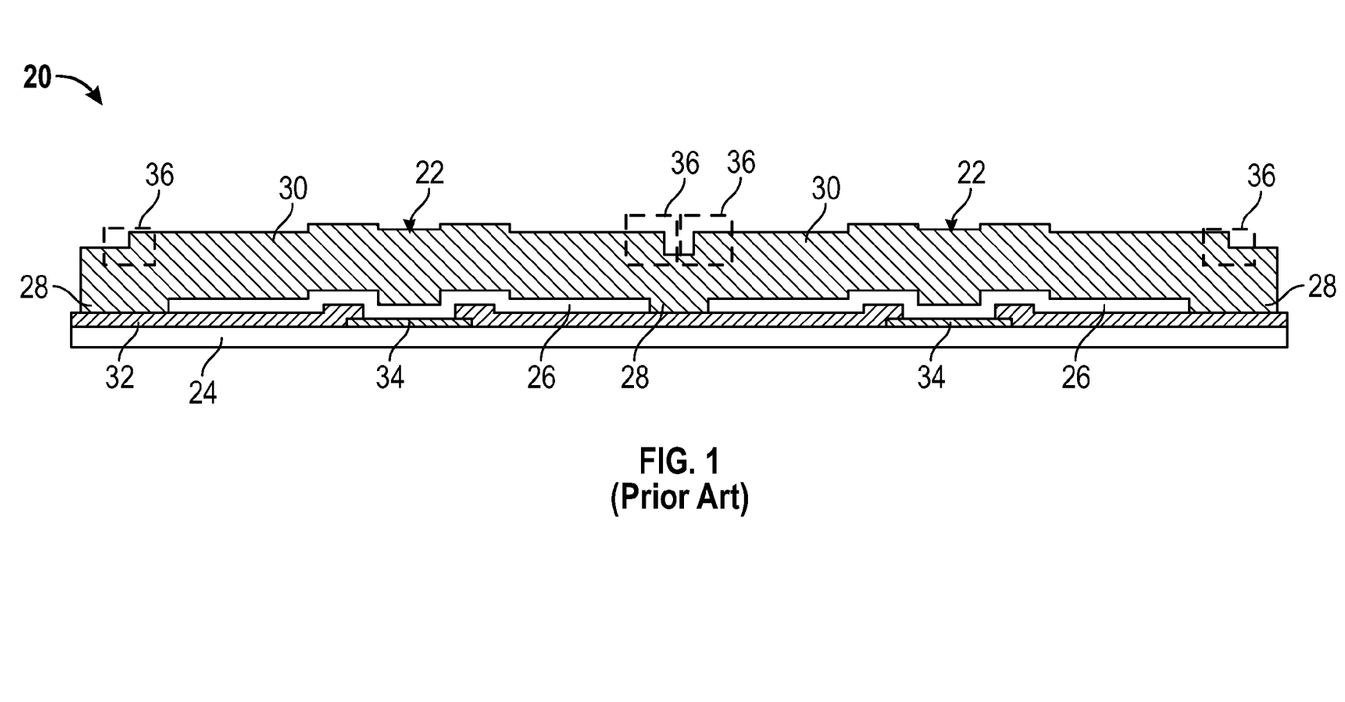
FIG. 1 is a simplified cross-sectional view of a MEMS capacitive pressure sensor (partially shown) including adjacent polysilicon membrane structures each enclosing a hermetically-sealed cavity, as illustrated in accordance with the teachings of prior art.

FIG. 1 is a simplified cross-sectional view of a MEMS capacitive pressure sensor 20 (partially shown), as illustrated in accordance with the teachings of prior art. The illustrated portion of MEMS pressure sensor 20 includes two neighboring membrane structures 22 formed over a common substrate 24 and each enclosing an inner void or cavity 26. As viewed in cross-section, membrane structures 22 each include two opposing anchor regions 28 and a flexible diaphragm region 30. Diaphragm regions 30 extend laterally across anchor regions 28 and are effectively suspended above cavities 26. Membrane structures 22 are formed from polycrystalline silicon and will consequently be referred to as "polysilicon membrane structures 22" hereafter. Substrate 24 may also be fabricated from an electrically-conductive silicon material, such as a single crystal silicon. A dielectric layer 32 is formed over substrate 24 to provide electrical isolation between electrically-conductive membrane structures 22 and the underlying substrate 24. A sense electrode 34 is further provided within each cavity 26 and positioned immediately below the flexible diaphragm region 30 of each polysilicon membrane structure 22. Although not shown in FIG. 1 for clarity, an additional dielectric layer, such as a thermally grown oxide, will typically be formed between electrodes 34 and substrate 24. Each electrode 34 is exposed through an opening provided in overlying dielectric layer 32 and spaced from its respective diaphragm region 30 by a vertical gap. As a result of this arrangement, a capacitive coupling is created with each electrode 34 serving as a lower plate, the neighboring electrically-conductive diaphragm region 30 serving as the upper plate, and the gas or vacuum within each cavity 26 serving as the electrical insulator.

Inner cavities 26 of MEMS pressure sensor 20 are hermetically sealed and each contain a known reference pressure; e.g., each inner cavity 26 may be partially evacuated or, instead, pressurized with nitrogen or another inert gas prior to sealing. With reference to the exemplary orientation shown in FIG. 1, the lower face or bottom surface of each diaphragm region 30 is exposed to the reference pressure contained within its respective cavity 26, while the upper face or top surface of each diaphragm region 30 is open or exposed to the ambient environment. During operation of MEMS pressure sensor 20, the exposed upper faces of diaphragm regions 30 are placed in fluid communication with the liquid or gas for which pressure measurements are to be taken. As the pressure external to MEMS pressure sensor 20 varies, so too does the pressure differential across diaphragm regions 30. Electrically-conductive diaphragm regions 30 deflect inwardly or outwardly in response to these changes in pressure differential, and the capacitances of the capacitive structures that include diaphragm regions 30, electrodes 34, and the gaps between them fluctuate accordingly. Utilizing non-illustrated interconnect lines electrically coupled to diaphragm regions 30 and electrodes 34, the changes in capacitance can be monitored (e.g., by a non-illustrated integrated circuit packaged with MEMS pressure sensor 20) and the pressure external to MEMS pressure sensor 20 can be calculated.

Figure 2:
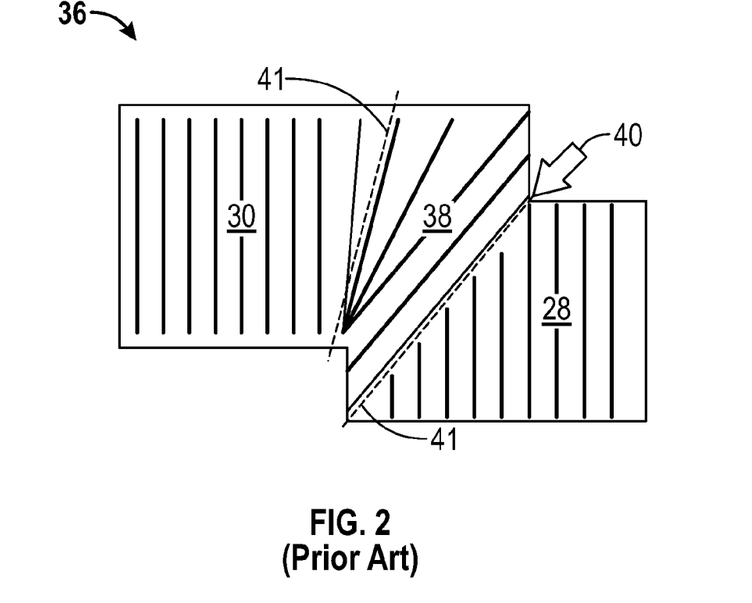
FIG. 2 is a cross-sectional view of an outer corner region of one of the polysilicon membrane structures shown in FIG. 1 generically illustrating the irregular or non-parallel crystalline grain structure thereof.
Figure 3:
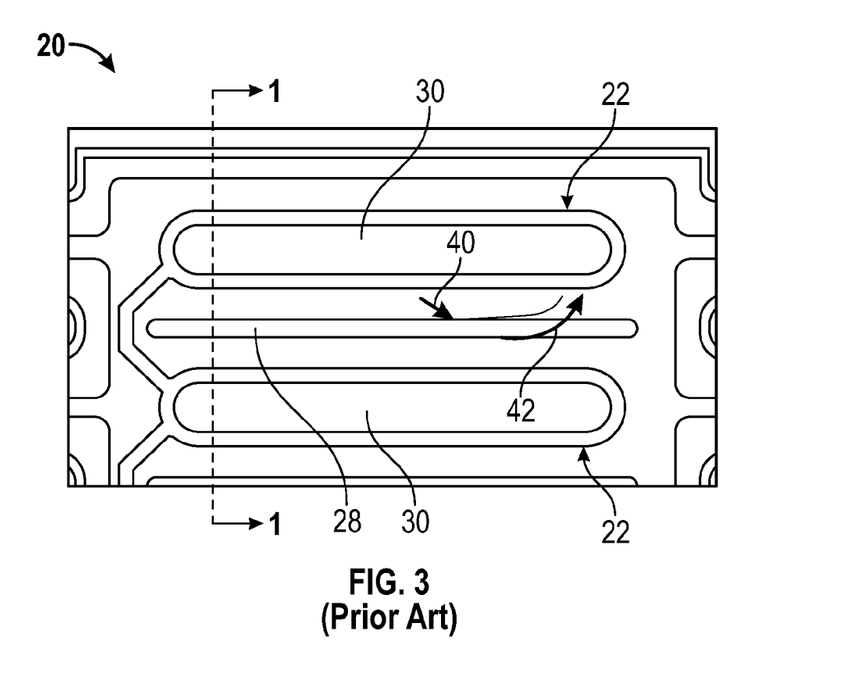
FIG. 3 is an optical microscope image of a top surface of the MEMS capacitive pressure sensor shown in FIG. 1 illustrating one manner in which a crack may form within a polysilicon membrane structure and propagate toward the centerline of a nearby diaphragm region.

During fabrication of MEMS pressure sensor 20, membrane structures 22 may be formed via the blanket deposition of polycrystalline silicon over a body of sacrificial material, which is subsequently removed to produce inner cavities 26. Polysilicon membrane structures 22 may thus be imparted with an irregular or non-parallel crystalline structure in certain regions thereof, such as near the outer peripheral edge or corner portions of membrane structures 22 (identified in FIG. 1 by circles 36) due to the accumulation or build-up of the silicon crystal lattice over a non-planar or uneven surface; that is, a surface having a roughness or feature height greater than about 0.1 micron (μm). FIG. 2 is a cross-sectional view of one such outer edge portion of one membrane structure 22 generically illustrating this irregular crystalline morphology. As can be seen, outer edge portion 36 includes a stepped transitional region 38, which has a different grain orientation as compared to neighboring diaphragm region 30 and anchor region 28. The grain structure across the outer edge portion 36 is thus non-uniform or non-parallel and includes interfaces or boundaries at which grains of disparate orientations merge (identified in FIG. 2 by dashed lines 41). Such non-parallel grain boundaries are structurally weakened; and, when subject to concentrated mechanical stress, may crack or fracture. In particular, cracks may form along the interfaces between different crystalline morphologies at high stress concentration areas, such as the crack initiation point identified in FIG. 2 by arrow 40. After formation, the cracks may then propagate outward toward the centerline of the neighboring diaphragm region 30. This may be further appreciated by referring to FIG. 3, which is optical microscope image of a physical implementation of MEMS pressure sensor 20 in plan view. In FIG. 3, arrow 40 identifies a crack initiation point and arrow 42 identifies an elongated crack, which has propagated outward from initiation point 40 toward the centerline of the nearby diaphragm region 30.

Cracking of polysilicon membrane structures 22 can be problematic for multiple reasons. Cracking of polysilicon membrane structures 22 can alter the structural characteristics of diaphragm regions 30 thereby affecting the reliability of the capacitive output of MEMS pressure sensor 20. In severe cases, cracking of polysilicon membrane structures 22 can compromise the hermetically-sealed environment of cavities 26 allowing the inflow or outflow of gas, altering the predetermined reference pressure, and again rendering the output of MEMS pressure sensor 20 less reliable. As repair of cracked polycrystalline membrane structures is typically impractical, MEMS pressure sensors having such structural defects generally cannot be salvaged. Cracking of polycrystalline membrane structures can thus result in significant losses in production yields, which can be as high as 5% in certain manufacturing processes. Containment tests can be performed to detect cracking of the polycrystalline membrane structures; however, such tests are costly, time consuming, and can still fail to detect cracked polysilicon membrane structures prior to release of the MEMS pressure sensors to customers.

The following describes embodiments of a method for fabricating a MEMS device, such as a MEMS capacitive pressure sensor, including multi-layer membrane structures having improved mechanical strength and enhanced resistance to the formation and propagation of cracks. Embodiments of the below-described fabrication method improve polycrystalline silicon grain uniformity across at least the upper portion of the membrane structure, most notably at the outer peripheral edge or corner regions of an upper polysilicon membrane layer positioned over the anchor regions thereof. In so doing, crack initiation points are largely eliminated from the membrane structures. In the case of a MEMS pressure sensor, this produces a stronger diaphragm less prone to cracking during fabrication and pressure loading. Embodiment of the below-described fabrication method can be advantageously employed in the fabrication of various different types of MEMS devices having membrane structures at least partially enclosing an inner void or cavity. By way of non-limiting illustration, an example of a first method suitable for fabricating a MEMS capacitive pressure sensor is described below in conjunction with FIGS. 4-12, and an example of a second method suitable for fabricating a MEMS capacitive pressure sensor is described below in conjunction with FIGS. 13-17.

FIGS. 4-11 are simplified cross-sectional views of a MEMS capacitive pressure sensor 50 (partially shown), as shown at various stages of manufacture and produced in accordance with a first exemplary embodiment of the present invention. As shown in FIGS. 4-11 and further below, MEMS pressure sensor 50 is offered by way of non-limiting example only; it is emphasized that the below-described fabrication process can be utilized to produce MEMS devices other than capacitive pressure sensors. Furthermore, the fabrication steps described below in conjunction with FIGS. 4-11 can be performed in alternative orders, certain steps may be omitted in alternative embodiments, and additional steps may be performed in alternative embodiments. Description of structures and processes known within the microelectronic device and semiconductor industries may be limited or omitted entirely without providing the well-known process details.

Figure 4:
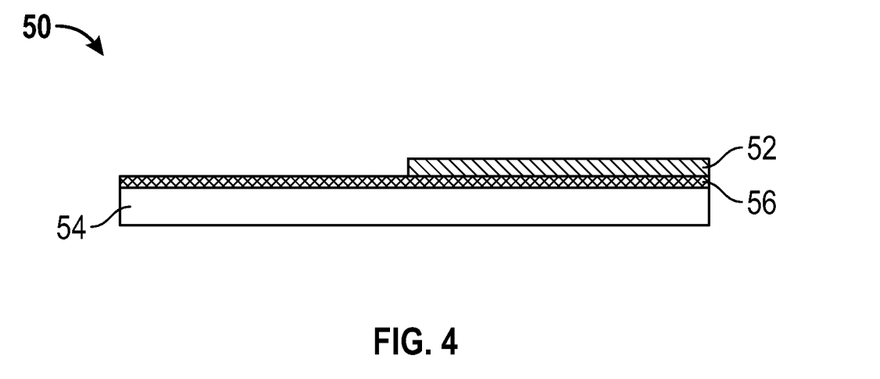
FIGS. 4-11 are cross-sectional views of a MEMS capacitive pressure sensor having a crack resistant multi-layer membrane structure, as shown at various stages of manufacture and produced in accordance with a first exemplary embodiment of the present invention.

With initial reference to FIG. 4, fabrication of MEMS pressure sensor 50 commences with the provision of a substrate 54 and the formation of an electrode layer 52 thereover. Substrate 54 may be comprised of at least one semiconductor material and is preferably comprised of silicon. In one implementation, substrate 54 comprises a single crystal silicon substrate produced by singulation of a bulk silicon wafer. In an embodiment, multiple pressure sensors simultaneously are fabricated on a bulk silicon wafer, and singulation occurs later in the process. However, for ease of illustration, the fabrication method depicted in conjunction with FIGS. 4-11 and 13-16 depicts portions of a single device. In embodiments wherein substrate 54 is electrically conductive, an intervening dielectric layer 56 may be formed between electrode layer 52 and the upper surface of substrate 54. An electrically-conducive material may then be deposited over dielectric layer 56 and patterned to yield electrode layer 52 including at least one sense electrode 52(a) (FIG. 5) and an electrically-conductive interconnect line or trace 52(b) (FIG. 5), which routes electrical signals to and/or from the sense electrode. Although not shown in FIG. 4 for clarity, a similar interconnect line may be formed to route electrical signals to and/or from the subsequently-formed membrane structure (described below). Dielectric layer 56 is conveniently formed by growing an oxide over the upper surface of substrate 54; e.g., in an embodiment wherein substrate 54 comprises polycrystalline silicon, substrate 54 may be heated in an oxidizing ambient to grow a layer of silicon oxide thereof. Electrode layer 52 is conveniently formed by blanket deposition of an electrically-conductive material over dielectric layer 56 and subsequent lithographical patterning. For example, dielectric layer 56 may be formed by the chemical vapor deposition (CVD) or physical vapor deposition (PVD) of polycrystalline silicon. In one embodiment, dielectric layer 56 is grown to a thickness of about 2 microns ($\mu$m), and electrode layer 52 is deposited to a thickness of about 0.35 $\mu$m, although dielectric layer 56 and/or electrode layer 52 may be thicker or thinner in other embodiments.

Figure 5:
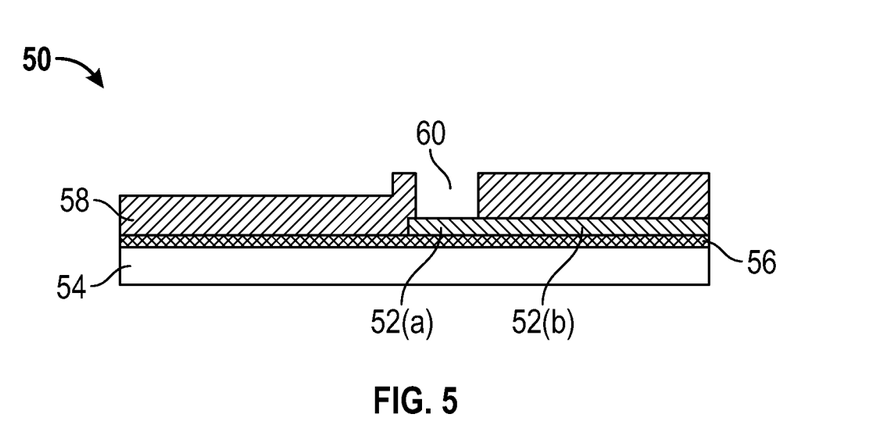
Figure 6:
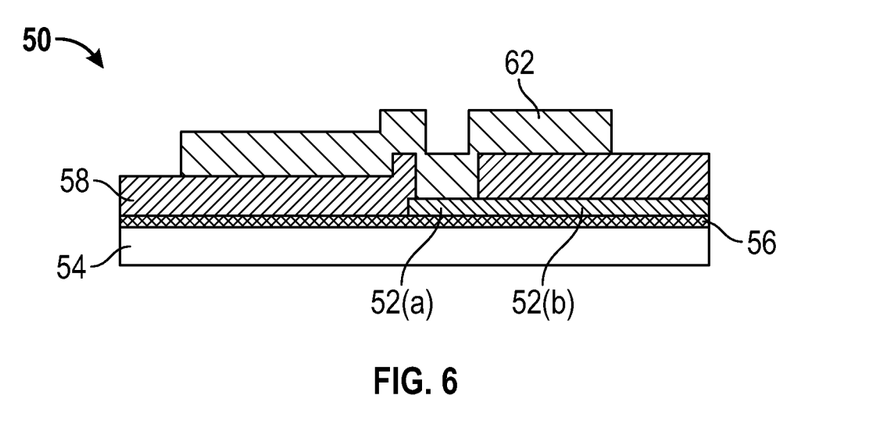

As illustrated in FIG. 5, a second dielectric layer 58 is next formed over patterned electrode layer 52 and first dielectric layer 56. In one embodiment, dielectric layer 58 is formed via the deposition of nitride, which may be deposited to a thickness of about 0.5 $\mu$m, although dielectric layer 58 may be thicker or thinner, as well. After deposition thereof, dielectric layer 58 is patterned to create at least one electrode opening 60 through which sense electrode 52(a) is at least partially exposed. A layer or body of sacrificial material 62 (referred to herein as "sacrificial body 62") is then deposited over substrate 54 and, specifically, onto dielectric layer 58, into electrode opening 60, and over sense electrode 52(a) to produce the structure shown in FIG. 6. Sacrificial body 62 may be formed by the deposition of any material amenable to subsequent removal utilizing, for example, a wet etchant to produce one or more cavities within the subsequently-fabricated multi-layer membrane structure 64, 74, as described below in conjunction with FIGS. 9-12. After deposition of the layer from sacrificial body 62 is formed, the layer is then patterned to define sacrificial body 62 and impart body 62 with its desired width and length. In one embodiment, sacrificial body 62 is formed by deposition of a phosphosilicate glass (PSG), which can subsequently removed utilizing a hydrogen fluoride (HF) etch chemistry. Other materials suitable for formation of sacrificial include, but are not limited to, un-doped Silicon Oxide or Boron Phosphosilicate Glass (BPSG). By way of non-limiting example, sacrificial body 62 may be deposited to a thickness of about 0.5 $\mu$m, although sacrificial body 62 may be thicker or thinner in further embodiments.

Figure 7:
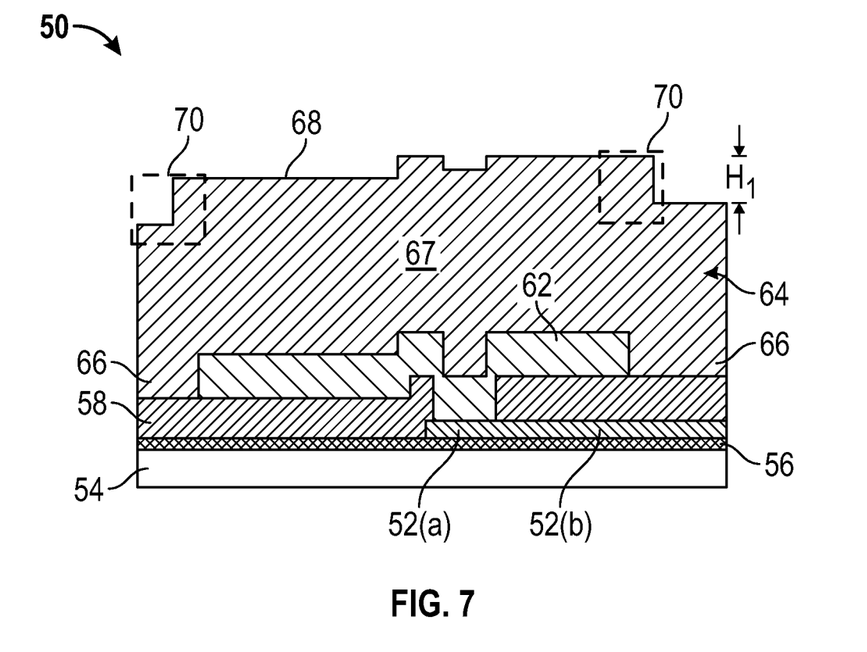

Continuing with the exemplary MEMS fabrication method, and referring now to FIG. 7, a first or base membrane layer 64 is next formed over and around sacrificial body 62. More specifically, base membrane layer 64 is deposited directly onto sacrificial body 62 and extends laterally beyond the edges of body 62 to define, in cross-section, two opposing anchor regions 66 and a laterally-elongated body or bridge region 67, which extends laterally between anchor regions 66 and over sacrificial body 62. In the illustrated example, base membrane layer 64 fully encloses or envelops sacrificial body 62, and anchor regions 66 collectively form a ring-shaped structure extending around the outer perimeter of body 62, when viewed in a top-down or plan view. As will be described below, a cap membrane layer comprised of polycrystalline silicon is later deposited over base membrane layer 64 after polishing thereof. Thus, to promote bonding and to minimize any mismatch in Coefficient of Thermal Expansion (CTE), base membrane layer 64 is preferably also formed via the deposition of a polycrystalline silicon having a formulation substantially identical to the polycrystalline silicon from which the cap membrane layer is formed; however, the possibility that base membrane layer 64 can be fabricated from a different material is by no means excluded. Base membrane layer 64 may be deposited to a thickness of about 2 µm in an embodiment, although the thickness of membrane layer 64 may vary amongst embodiments. It should be appreciated that the thickness of layer 64 is somewhat arbitrary as a significant portion of layer 64 may be removed during the polishing process described below in conjunction with FIG. 8.

As an inherent result of the deposition process utilized to form base membrane layer 64 taken in combination with the irregular surface topology of the surface over which membrane layer 64 has been deposited (resulting from the decrease in height when transitioning from sacrificial body 62 to dielectric layer 58), base membrane layer 64 is likewise imparted with non-planar or uneven geometry along its upper surface 68. For example, as indicated in FIG. 7, the outer peripheral edge or corner regions 70 of base membrane layer 64 include stepped features, which are vertically aligned with the interface between anchor regions 66 and the sidewalls of sacrificial body 62 over which membrane layer 64 has been deposited. When considered in three dimensions, these stepped features may be a continual ledge or shelf that extends around the entire perimeter of base membrane layer 64. The height of these stepped features may be, for example, approximately the height of sacrificial body 62 (e.g., about 0.5 µm, identified in FIG. 7 as "$H_1$"). Notably, in embodiments wherein base membrane layer 64 comprises polycrystalline silicon, the morphology at the outer edge or corner regions 70 of base membrane layer 64 may be similar to the irregular or non-parallel morphology of corner regions 36 of MEMS pressure sensor 20 described above in conjunction with FIG. 2.

Figure 8:
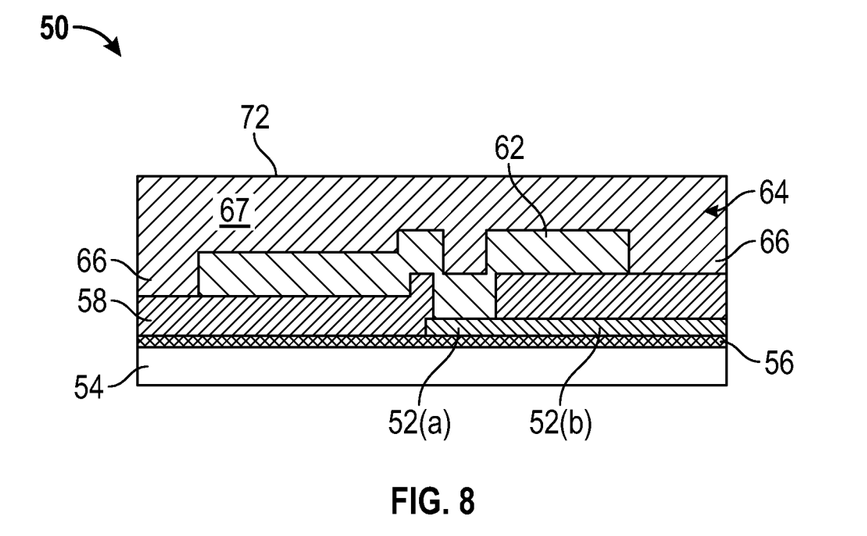

To remove the unfavorable grain structure from the upper regions of base membrane layer 64, at least in substantial part, the upper regions of base membrane layer 64 are removed. While this can be accomplished utilizing, for example, an etching process in an embodiment, it is preferred that a polishing process is carried-out to remove the upper regions of base membrane layer 64. More specifically, a Chemical Mechanical Planarizing (CMP) process may be utilized to remove a predetermined thickness from base membrane layer 64 and impart layer 64 with a planar upper surface; e.g., after CMP polishing, the upper surface of membrane layer 64 may have surface roughness or feature height of less than about 0.1 µm, although the surface roughness or feature height may be greater in certain embodiments. In preferred implementations, the thickness removed from base membrane layer 64 is sufficient to eliminate the stepped features from outer edge or corner regions 70 in their entirety, while being sufficiently limited to preserve a portion of the bridge region 67 overlying sacrificial body 62. In this regard, the predetermined thickness removed during polishing may be greater than or equal to the height of the step features shown in FIG. 7 (e.g., about 0.5 µm), while being less than the thickness of bridge region 67 of base membrane layer 64. In one embodiment wherein bridge region 67 has a thickness of about 2 µm, the predetermined thickness removed pursuant to polishing may be about 1 µm, although the predetermined thickness removed may vary amongst different embodiments. The results of such a partial CMP polish are shown in FIG. 8. As can be seen, base membrane layer 64 has been imparted with a planar upper surface 72 and the stepped outer peripheral corner regions 70 (FIG. 7) of base membrane layer 64, as initially deposited, have now been removed.

Figure 9:
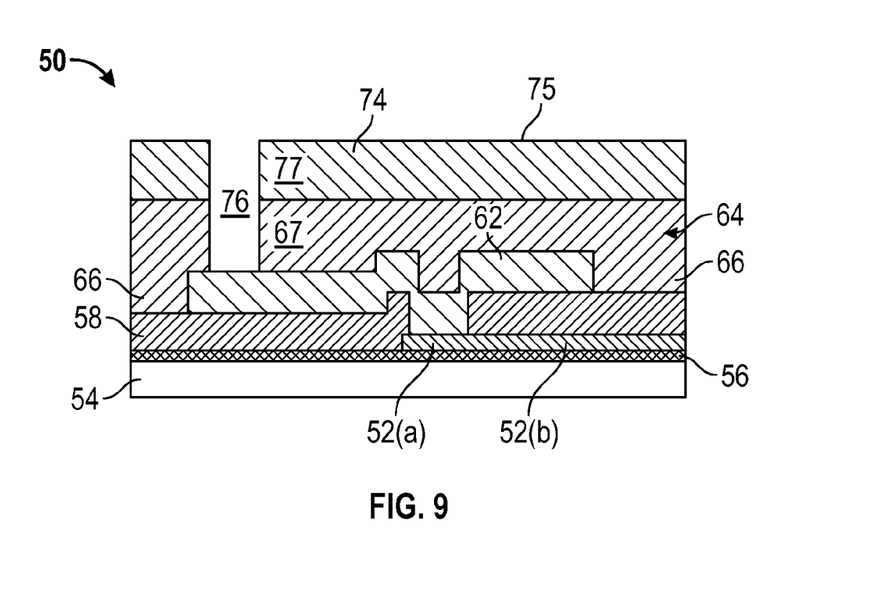

Subsequent to the above-described polishing process, and with reference to FIG. 9, a second or cap membrane layer 74 is deposited over the newly-planarized upper surface 72 of base membrane layer 64. Cap membrane layer 74 is formed via the deposition of polycrystalline silicon utilizing, for example, a CVD or PVD deposition technique. Due to the planar surface topology of base membrane layer 64, the upper surface 75 of cap membrane layer 74 is also imparted with a planar topology and a substantially parallel crystalline grain structure, as discussed more fully below in conjunction with FIG. 12. Cap membrane layer 74 may effectively replace the material removed from base membrane layer 64 during polishing. Collectively, cap membrane layer 74 and base membrane structure 64 form a multi-layer membrane structure 64, 74 including a flexible diaphragm region 77 extending laterally between anchor regions 66. In one embodiment, cap membrane layer 74 is deposited utilizing CVD or PVD process to a thickness sufficient to impart diaphragm region 77 with a thickness between about 1.0 µm and about 3.0 µm and, more specifically, with a thickness of about 2.0 µm, although diaphragm region 77 may be thicker or thinner, as well. By way of non-limiting example, the height of multi-layer membrane structure 64, 74 may be less than or equal to the width and length thereof such that membrane structure 64, 74 would not generally be considered a high aspect ratio structure; e.g., in one embodiment, the height of membrane structure 64, 74 may be between about 1 and about 5 µm, the width of structure 64, 74 may be between about 30 and about 80 µm, and the length of membrane structure 64, 74 may be between about 100 and about 300 µm, although these dimensions may be larger or smaller, as well.

Figure 10:
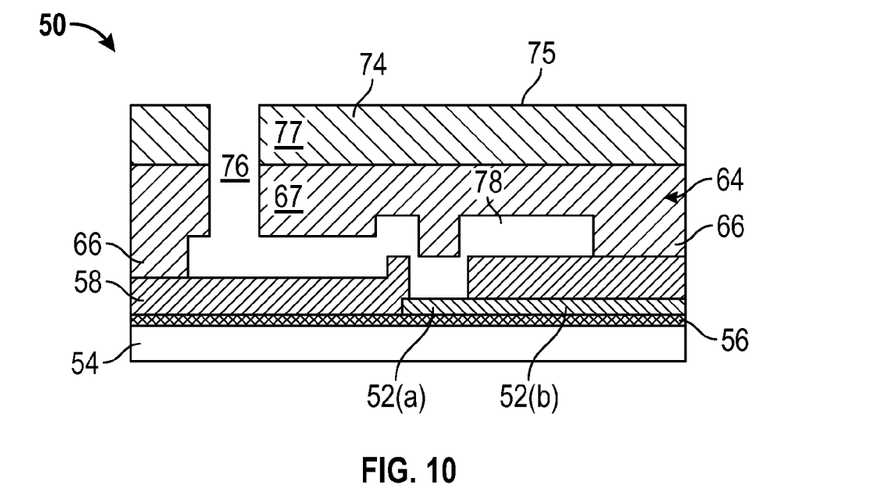
Figure 11:
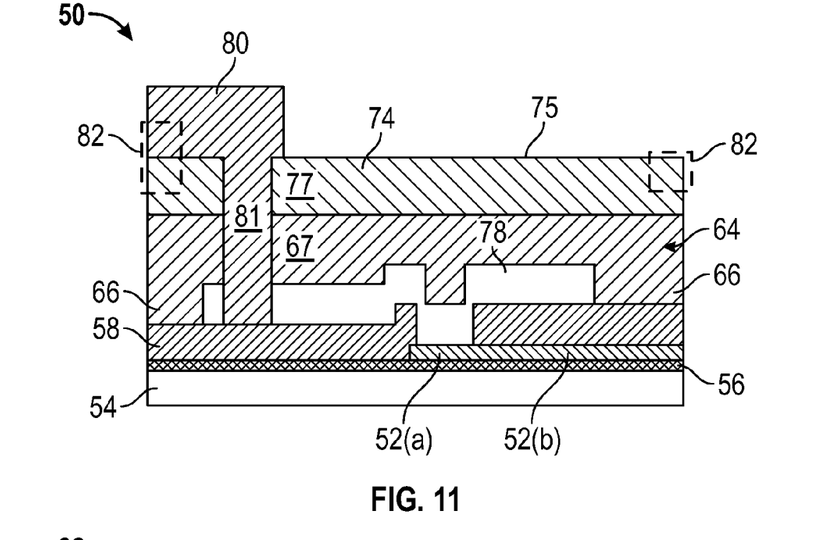
Figure 12:
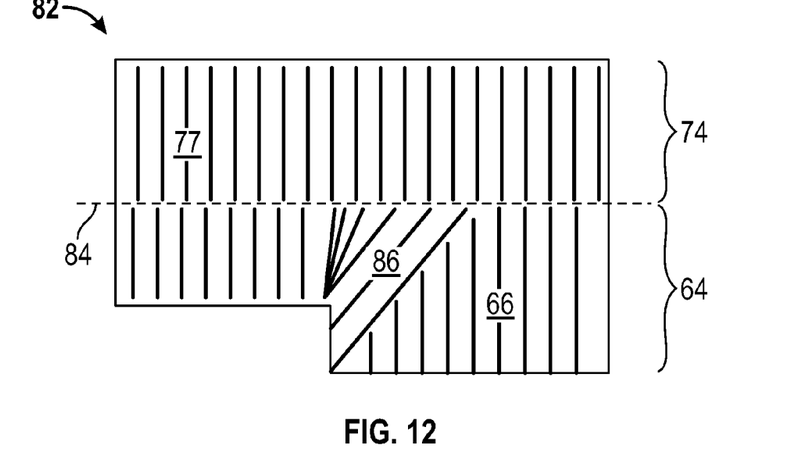
FIG. 12 is a cross-sectional view illustrating the substantially parallel crystalline grain structure of an outer corner region of the layer membrane structure shown in FIG. 11, which is resistant to the formation and propagation of cracks.

After deposition of cap membrane layer 74, at least one through hole, opening, or channel 76 is etched from the top surface 75 of diaphragm region 77 of multi-layer membrane structure 64, 74 to sacrificial body 62 (shown in FIG. 9). In the illustrated example wherein layers 64 and 74 form diaphragm region 77, channel 76 may be etched through both cap membrane layer 74 and base membrane layer 64. Channel 76 may be formed utilizing an anisotropic dry etch, which may be performed utilizing a silicon-selective chemistry, such as a potassium hydroxide (KOH) or a tetramethylammonium hydroxide (TMAH) etch chemistry. Channel 76 enables sacrificial body 62 to be exposed to and removed by a suitable etchant; e.g., in an embodiment wherein sacrificial body 62 is composed of PSG, a wet HF etch may be employed. As shown in FIG. 10, removal of sacrificial body 62 results in the formation of an inner void or cavity 78 within the dual layer membrane structure 64, 74. A reference pressure may then be created within cavity 78 by, for example, evacuation of cavity 78 or by filling cavity 78 with a pressurized gas, such as nitrogen. Afterwards, as shown in FIG. 11, cavity 78 may be hermetically sealed by, for example, depositing a sealant material 80 into channel 76 to form a plug 81 within channel 76. In one embodiment, sealant material 80 is a silicon oxide deposited utilizing a low temperature Plasma-Enhanced CVD or Low Pressure CVD performed with silane ($SiH_4$) or tetraethylorthosilicate ($Si(OC_2H_5)_4$ or "TEOS") chemistries. Additional processing steps may then be utilized to complete fabrication and/or packaging of MEMS capacitive pressure sensor 50, as conventionally known.

Due to the above-described fabrication process, a substantially uniform or parallel grain structure is created at the outer peripheral edge or corner regions 82 of dual layer membrane structure 64, 74 and, specifically, of polysilicon cap membrane layer 74. This may be more fully appreciated by referring FIG. 12, which generically illustrates in cross-section the morphology or crystalline grain structure of one corner region 82 of membrane structure 64, 74. As can be seen, polysilicon cap layer 74 is characterized by a substantially parallel grain structure throughout, including along the interface between cap layer 74 and base membrane layer 64 (identified in FIG. 12 by dashed line 84). While a non-parallel grain region 86 is still present in base membrane layer 64, this region has been greatly reduced in volume and is largely shielded from mechanical stress by the surrounding parallel grain structures. As a result, the strength of multi-layer membrane structure 64, 74 is increased, and the crack initiation points are eliminated. In a preferred embodiment, polysilicon cap membrane layer 74 consists substantially entirely of a parallel grain structure. As generically indicated in FIG. 12, the grain structure in top region 74 of multi-layer membrane structure 64, 74 is preferable because the grains are largely parallel and oriented with the growth lines substantially perpendicular or orthogonal to the upper surface of substrate 54.

Figure 13:
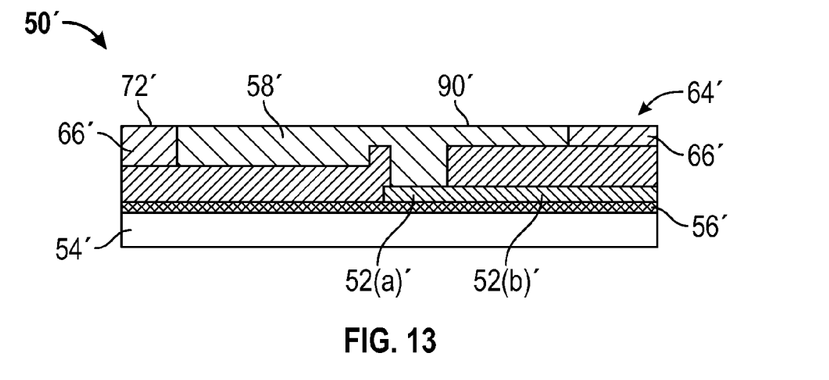
FIGS. 13-16 are cross-sectional views of a MEMS capacitive pressure sensor having a crack resistant multi-layer membrane structure, as shown at various stages of manufacture and produced in accordance with a second exemplary embodiment of the present invention.
Figure 14:
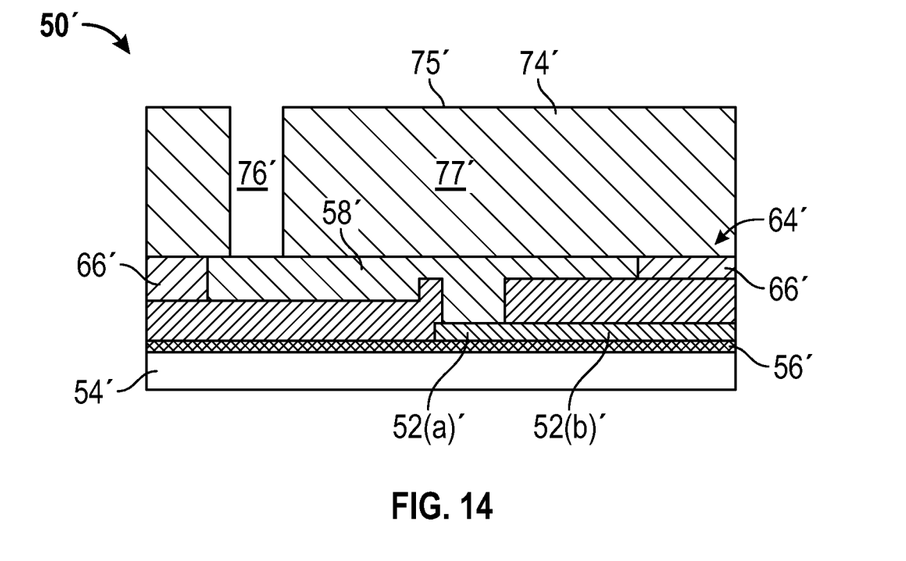
Figure 15:
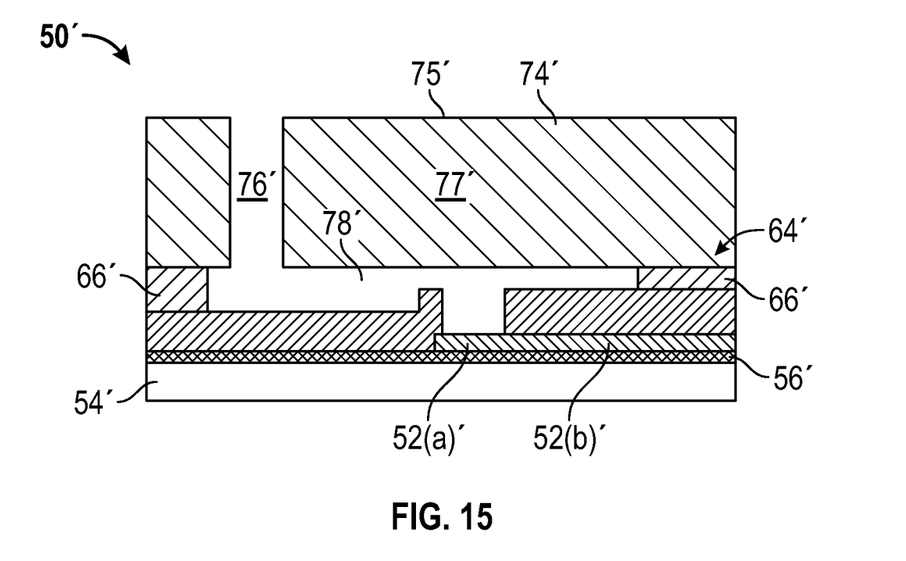

The foregoing has thus described an exemplary embodiment of a process for fabricating an enclosed-cavity MEMS device, wherein a multi-layer membrane structure is built or compiled over a base substrate such that membrane structure includes an upper silicon layer characterized by a substantially parallel grain morphology, including at the outer peripheral regions thereof. The upper silicon layer of the multi-layer membrane structure is deposited over a lower or base membrane layer, which has been planarized utilizing, for example, a CMP process. In the above-described exemplary embodiment, the CMP process only partially removes the portion of the base membrane layer overlying the sacrificial body; that is, referring briefly once again to FIG. 8, only a portion of the laterally-extending body or bridge region 67 of base membrane layer 64 was removed during polishing in the above-described process. However, in alternative embodiments, the laterally-extending bridge region of base membrane layer 64 may be removed in its entirety during CMP polishing. The results of such a full CMP process are shown in FIG. 13 wherein like reference numerals are utilized to denote like structural elements, but with the addition of a prime (') symbol to denote that device 50 (shown in FIGS. 4-12) and device 50' (shown in FIGS. 13-17), and their respective features, may differ to varying extents. As can be seen in FIG. 13, pursuant to such a full CMP polish, only anchor regions 66' of base membrane layer 64' remain. Furthermore, polishing has exposed sacrificial body 62' and imparted body 62' with a planar upper surface 90'. Stated differently, sufficient thickness has been removed during the CMP polish to not only eliminate the bridge portion of base membrane layer 62' in its substantial entirety and expose sacrificial body 62' therethrough, but polishing has continued beyond initial exposure of sacrificial body 62' to remove an upper portion thereof and impart sacrificial body 62' with a planar upper surface 72' that is flush or level with the planarized upper surface 72' of base membrane layer 64'.

Figure 16:
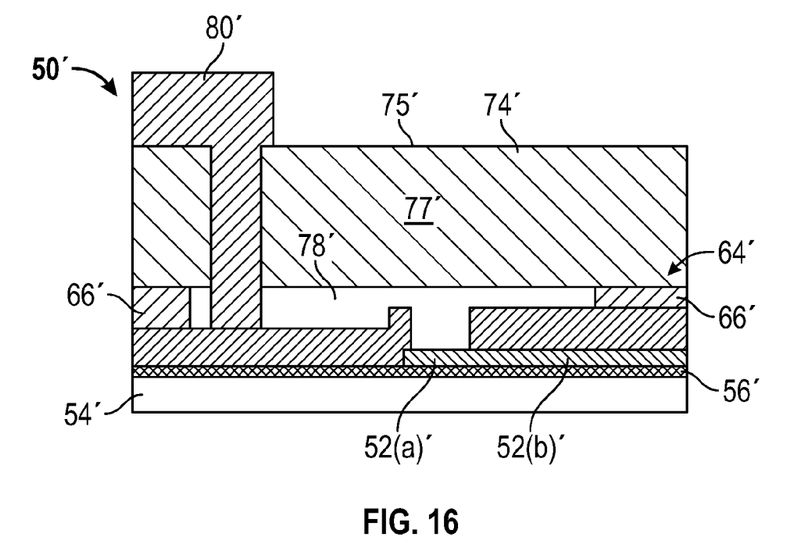
Figure 17:
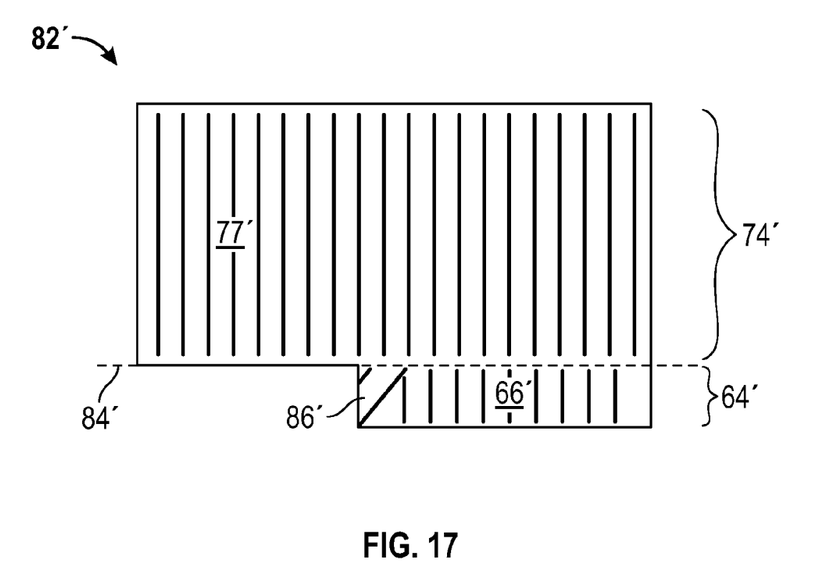
FIG. 17 is a cross-sectional view illustrating the substantially parallel crystalline grain structure of an outer corner region of the layer membrane structure shown in FIG. 16, which is resistant to cracking.

With continued reference to the manufacturing stage shown in FIG. 13, processing steps similar to those described above may then be performed to complete manufacture of MEMS pressure sensor 50'. For example, a cap silicon layer 74' with a substantially planar top surface 75' may deposited over the planarized upper surfaces of base membrane layer 64' and sacrificial body 62' thereby forming a dual layer membrane structure 64', 74' (FIG. 14); at least one channel 76' may be etched through cap silicon layer 74' and to sacrificial body 62' (FIG. 14); sacrificial body 62' may be removed through the channel 76' by, for example, exposure to a wet etchant to produce an inner void or cavity 78' within membrane structure 64', 74' (FIG. 15); a reference pressure may be created within cavity 78'; and cavity 78' may be hermetically sealed via the deposition of a sealant 80' over and into channel 76' (FIG. 16). As was the case previously, such a manufacturing process imparts the upper portions of the dual layer membrane structure 64', 74', including the peripheral corners of the membrane structure 64', 74', vertically aligned with anchor regions 66', with a substantially parallel crystalline grain structure resistant to the formation and propagation of cracks.

The foregoing has thus provided multiple exemplary embodiments of MEMS devices and methods for fabricating a MEMS device, such as a MEMS pressure sensor, including a multi-layer membrane structure having improved mechanical strength and enhanced resistance to the formation and propagation of cracks. Embodiments of the above-described fabrication method improve polycrystalline silicon grain uniformity across at least the upper portion of the membrane structure, most notably at the outer peripheral edge or corner regions of an upper polysilicon membrane layer. In so doing, crack initiation points may be completely or largely eliminated from the membrane structures. In the case of a MEMS pressure sensor, this produces a stronger diaphragm less prone to cracking during fabrication and pressure loading. Improvements in production yields and field quality of the MEMS devices are thus achieved. While described-above as including two membranes layers, the multi-layer membrane structure may include additional layers in further embodiments.

In one embodiment, the above-described MEMS fabrication method includes depositing or otherwise forming a sacrificial body over a substrate, producing a multi-layer membrane structure on the substrate, and removing at least a portion of the sacrificial body to form an inner cavity within the multi-layer membrane structure. The multi-layer membrane structure is produced by first forming a base membrane layer over and around the sacrificial body such that the base membrane layer has a non-planar upper surface. A predetermined thickness is removed from the base membrane layer by, for example, polishing to impart the base membrane layer with a planar upper surface. A cap membrane layer is then deposited or otherwise formed over the planar upper surface of the base membrane layer. The cap membrane layer is composed of polycrystalline silicon having a substantially parallel grain orientation.

In a further embodiment, the MEMS fabrication method includes forming a sense electrode on a substrate, depositing a dielectric layer over the electrode, forming a sacrificial body on the dielectric layer, and building or compiling a multi-layer polysilicon membrane over the sacrificial body. The multi-layer polysilicon membrane is built by depositing or otherwise forming multiple layers of polycrystalline silicon and planarizing each layer of polycrystalline silicon over which an additional layer of polycrystalline silicon is deposited such that at least the uppermost layer of the multi-layer polysilicon membrane is imparted with a substantially parallel grain structure. At least one channel is etched or otherwise formed through the multi-layer polysilicon membrane to the sacrificial body. At least a portion of the sacrificial body is removed or etched away to form an inner cavity at least partially enclosed by the multi-layer polysilicon membrane, and a plug is then formed in the at least one channel to hermetically seal the inner cavity.

The foregoing has also described embodiments of a crack resistant micromachined MEMS device. The MEMS device may include, for example, a substrate, a multi-layer membrane structure formed on the substrate, and a cavity at least partially enclosed by the multi-layer membrane structure. The multi-layer membrane structure includes, in turn, a base membrane layer and a cap membrane layer formed over the base membrane layer. The cap membrane layer comprises polycrystalline silicon or another material having a substantially parallel grain orientation at the outer edge regions of the cap membrane layer.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set-forth in the appended claims.

What is claimed is:

1. A Microelectromechanical Systems (MEMS) device, comprising:
   a substrate;
   a multi-layer membrane structure formed on the substrate, the multi-layer membrane structure comprising:
      a base membrane layer; and
      a cap membrane layer formed over the base membrane layer and having outer edge regions, the cap membrane layer comprising a material having a substantially parallel grain orientation at the outer edge regions of the cap membrane layer, wherein the multi-layer membrane structure comprises, in cross-section, opposing anchor regions and a flexible diaphragm region extending between the opposing anchor regions; and
   a cavity at least partially enclosed by the multi-layer membrane structure.

2. The MEMS device of claim 1 wherein the cap membrane layer and the base membrane layer each comprise polycrystalline silicon.

3. The MEMS device of claim 1 wherein a height of the multi-layer membrane structure is less than or equal to a width and a length thereof.

4. The MEMS device of claim 1 further comprising an electrode positioned beneath the flexible diaphragm region and exposed within the cavity, and wherein the cavity is hermetically sealed and contains a known reference pressure acting on an inner surface of the flexible diaphragm region.

5. The MEMS device of claim 1 wherein the anchor regions are formed by the base membrane layer, and wherein the flexible diaphragm region is formed by at least the cap membrane layer.

6. The MEMS device of claim 1 wherein the base membrane layer includes a region having a non-parallel grain orientation proximate an interface between the base membrane layer and the cap membrane layer, and wherein the cap membrane layer overlies the region of the base membrane layer having the non-parallel grain orientation.

7. The MEMS device of claim 1 further comprising:
   a channel extending through the multi-layer membrane structure and to the cavity; and
   a plug formed in the channel to hermetically seal the cavity.

8. The MEMS device of claim 7 wherein the channel extends through the base membrane layer and through the cap membrane layer.

9. The MEMS device of claim 7 wherein the channel extends through the cap membrane layer, but not through the base membrane layer.

10. The MEMS device of claim 1 wherein the base membrane layer has an upper planarized surface over which the cap membrane layer is deposited.

11. A Microelectromechanical Systems (MEMS) device, the MEMS device comprising:
   a substrate;
   a sense electrode on the substrate;
   a sense dielectric layer over the sense electrode;
   a multi-layer polysilicon membrane produced by forming multiple layers of polycrystalline silicon and planarizing at least one layer of polycrystalline silicon over which an additional layer of polycrystalline silicon is deposited such that at least an uppermost layer of the multi-layer polysilicon membrane is imparted with a substantially parallel grain structure, wherein the multi-layer polysilicon membrane comprises, in cross-section, opposing anchor regions and a flexible diaphragm region extending between the opposing anchor regions;
   an inner cavity at least partially enclosed by the multi-layer polysilicon membrane;
   at least one opening formed in the multi-layer polysilicon membrane and extending to the inner cavity;
   a sealant material deposited into the at least one opening and hermetically sealing the inner cavity; and
   a known reference pressure contained within the inner cavity to which the multi-layer polysilicon membrane is exposed.

12. The MEMS device of claim 11 wherein the uppermost layer of the multi-layer polysilicon membrane forms at least a portion of the flexible diaphragm region, while overlying the opposing anchor regions.

13. The MEMS device of claim 12 wherein the uppermost layer of the multi-layer polysilicon membrane forms the flexible diaphragm region in its substantial entirety.

14. The MEMS device of claim 11 wherein multi-layer polysilicon membrane comprises one or more peripheral corners, which are vertically aligned with the opposing anchor regions.

15. The MEMS device of claim 11 wherein the at least one layer of polycrystalline silicon that is planarized comprises a non-parallel grain region over which the additional layer of polycrystalline silicon is deposited.

16. A Microelectromechanical Systems (MEMS) device, the MEMS device comprising:
   a substrate;
   a multi-layer polysilicon membrane comprising:
      a first polycrystalline silicon layer having an upper planarized surface and a non-parallel grain region; and an uppermost polycrystalline silicon layer deposited over the upper planarized surface and overlying the non-parallel grain region of the first polycrystalline silicon layer, wherein the multi-layer polysilicon membrane comprises, in cross-section, opposing anchor regions and a flexible diaphragm region extending between the opposing anchor regions; and an inner cavity at least partially enclosed by the multi-layer polysilicon membrane.

17. The MEMS device of claim 16 wherein the non-parallel grain region is located at an interface between the opposing anchor regions and the flexible diaphragm region.

18. The MEMS device of claim 16 wherein the first polycrystalline silicon layer includes the anchor regions joined to the substrate, and wherein the uppermost polycrystalline silicon layer comprises outer peripheral corner regions vertically aligned with the anchor regions and having a substantially parallel grain structure.

* * * * *